United States Patent
Yoshimura et al.

(10) Patent No.: US 9,767,779 B2
(45) Date of Patent: Sep. 19, 2017

(54) OPERATOR DEVICE FOR ELECTRONIC MUSICAL INSTRUMENT

(71) Applicant: Yamaha Corporation, Hamamatsu-shi, Shizuoka-ken (JP)

(72) Inventors: Michiko Yoshimura, Hamamatsu (JP); Ichiro Osuga, Hamamatsu (JP); Hiroshi Harimoto, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 15/282,797

(22) Filed: Sep. 30, 2016

(65) Prior Publication Data

US 2017/0092250 A1    Mar. 30, 2017

(30) Foreign Application Priority Data

Sep. 30, 2015   (JP) ................. 2015-193263

(51) Int. Cl.
| | |
|---|---|
| *G10H 1/32* | (2006.01) |
| *G10H 1/34* | (2006.01) |
| *H01H 13/702* | (2006.01) |
| *H01H 13/80* | (2006.01) |
| *H05K 1/02* | (2006.01) |
| *G10H 1/055* | (2006.01) |

(52) U.S. Cl.
CPC .......... *G10H 1/344* (2013.01); *G10H 1/0558* (2013.01); *H01H 13/702* (2013.01); *H01H 13/80* (2013.01); *H05K 1/0293* (2013.01); *G10H 2220/285* (2013.01); *H01H 2227/012* (2013.01); *H01H 2231/018* (2013.01); *H05K 2201/0388* (2013.01)

(58) Field of Classification Search
CPC ...... H01H 2231/018; G10H 1/32; G10H 1/34; G10H 3/00; G10H 3/22; B25J 11/00
See application file for complete search history.

(56) References Cited

U.S. PATENT DOCUMENTS

| | | | |
|---|---|---|---|
| 4,527,030 A | | 7/1985 | Oelsch |
| 4,580,478 A | * | 4/1986 | Brosh ................. G10H 1/0555 84/688 |

(Continued)

FOREIGN PATENT DOCUMENTS

JP   H-07181970 A   7/1995

OTHER PUBLICATIONS

European Search Report mailed Feb. 1, 2017, for EP Application No. 16191061.7, seven pages.

*Primary Examiner* — Marlon Fletcher
(74) *Attorney, Agent, or Firm* — Morrison & Foerster LLP

(57) ABSTRACT

A switch is constituted by a movable conductive portion and a pair of fixed conductive portions. The fixed conductive portions are arranged on a substrate, and are each constituted by at least one strip member. A first main conductive pattern and a second main conductive pattern are arranged on the substrate in correspondence with the fixed conductive portions. The movable conductive portion electrically shorts the pair of fixed conductive portions upon coming into contact with both of them. The strip members that constitute the fixed conductive portions each have a first end portion and a second end portion in the extending direction, and the end portions are electrically connected to the corresponding main conductive patterns.

9 Claims, 21 Drawing Sheets

(56) References Cited

U.S. PATENT DOCUMENTS

| | | | |
|---|---|---|---|
| 5,660,269 A | 8/1997 | Fujiwara | |
| 5,952,629 A * | 9/1999 | Yoshinaga | G10H 1/344 |
| | | | 200/1 B |
| 2003/0232518 A1 | 12/2003 | Tsutsui | |
| 2017/0092250 A1 * | 3/2017 | Yoshimura | G10H 1/344 |

* cited by examiner

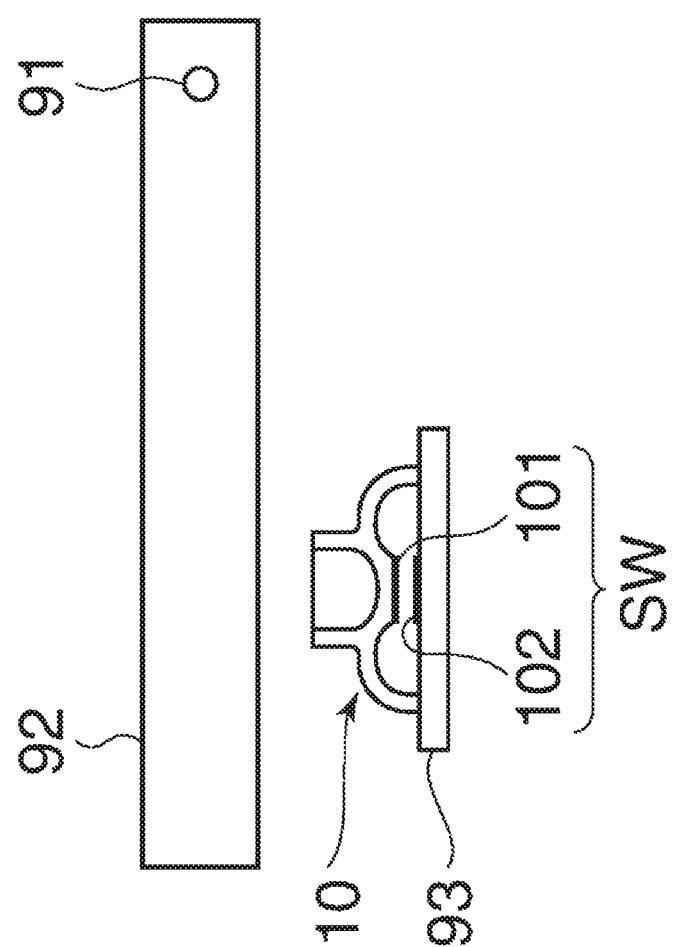

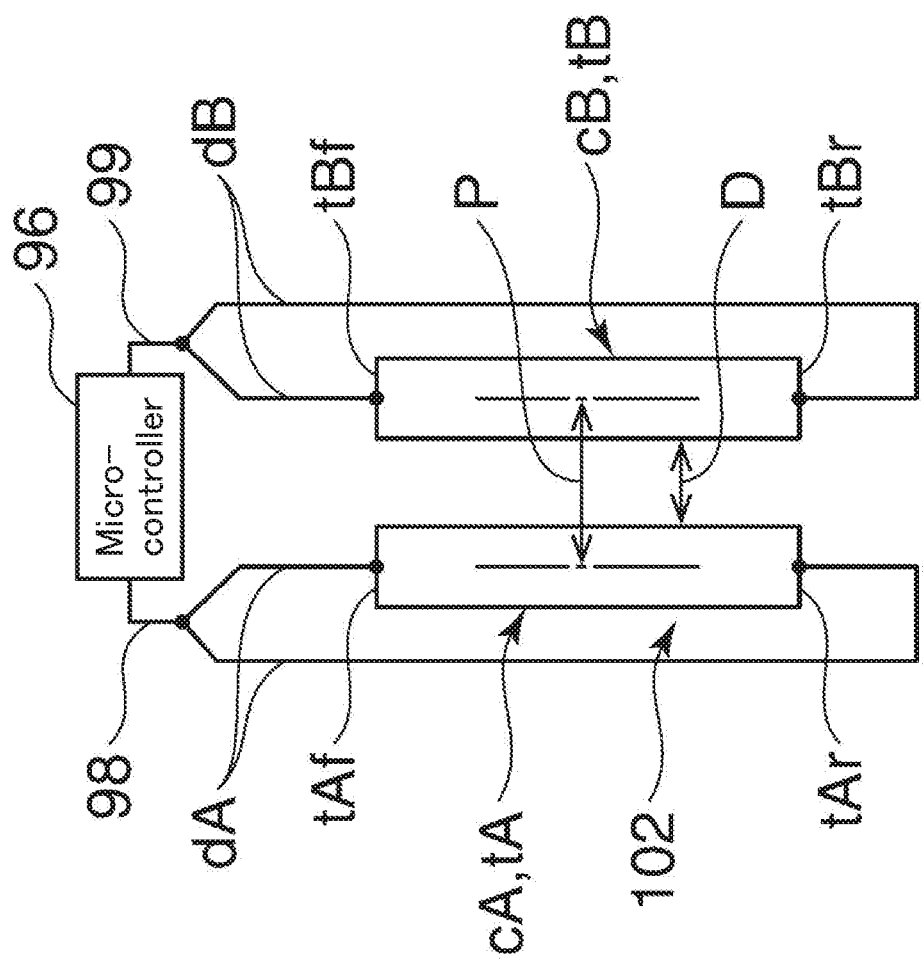

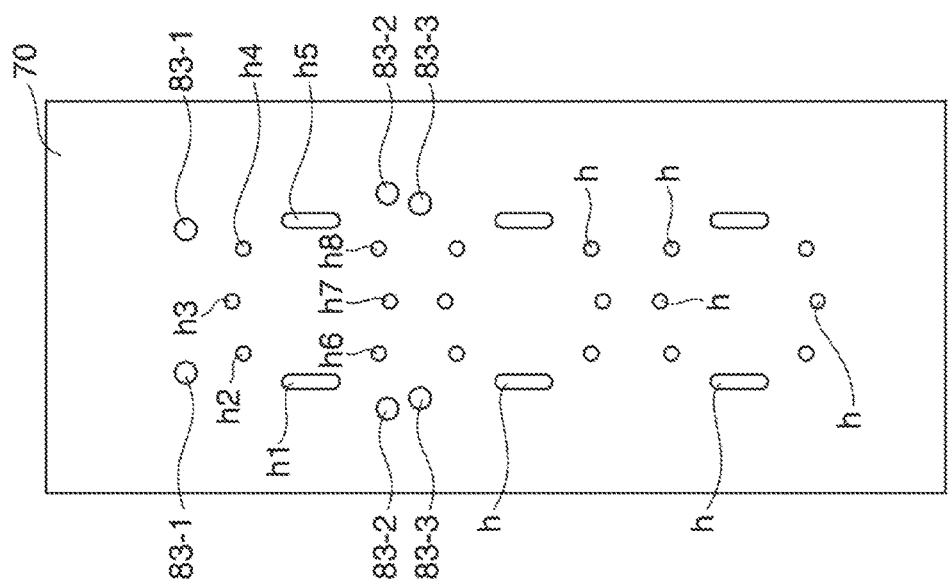

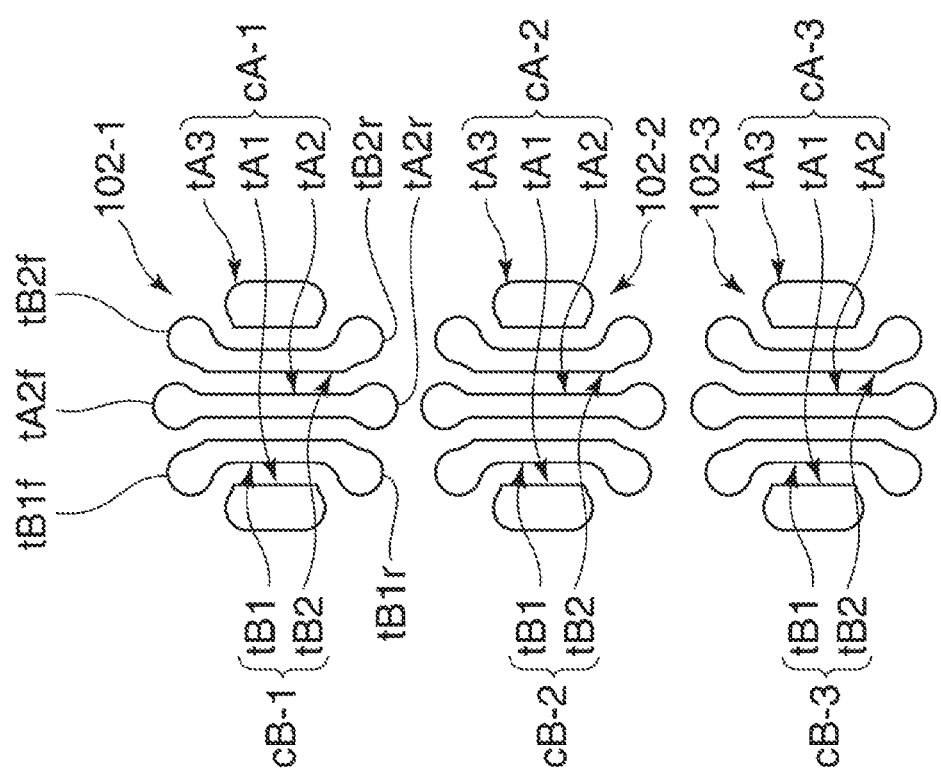

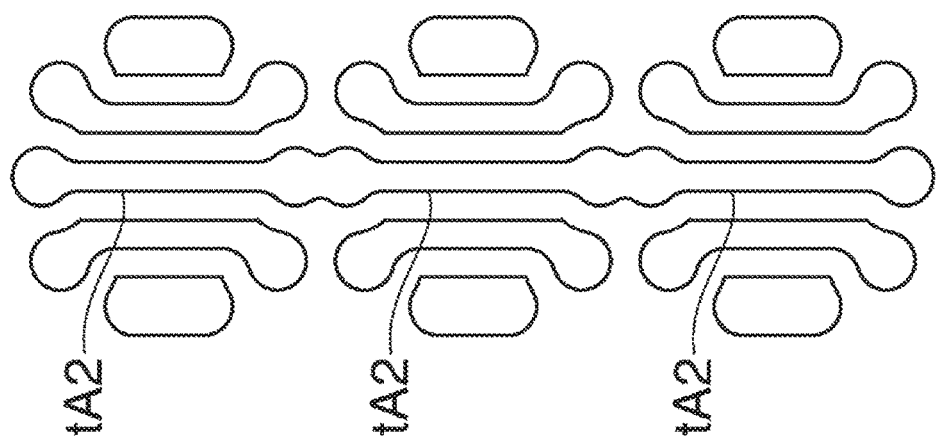

OPERATOR DEVICE FOR ELECTRONIC MUSICAL INSTRUMENT

CROSS REFERENCE

This application claims priorities to Japanese Patent Applications No. 2015-193263 filed on Sep. 30, 2015, which is hereby incorporated by reference in its entirety.

TECHNICAL FIELD

The present invention relates to an operator device for an electronic musical instrument that detects an operation when an operator is operated so as to electrically short a pair of fixed conductive portions with a movable conductive portion.

BACKGROUND ART

Conventionally, it is known that in an operator device for an electronic musical instrument such as a keyboard instrument, a pair of fixed conductive portions are mounted on a printed circuit board, and a movable conductive portion that can be moved by an operator is provided so as to oppose these fixed contact patterns. In this type of operator device, as illustrated in FIG. 14 and the like of Patent Literature 1 noted below, the fixed conductive portions are widely known to be constituted by a pair of comb teeth-shaped contact patterns, and the movable conductive portion brings the pair of comb teeth-shaped fixed contact patterns into conduction, via itself, upon coming into contact with them. The fixed conductive portions and the movable conductive portion are generally constituted by carbon or the like. FIGS. 13A and 13B are schematic diagrams showing contact between typical comb teeth-shaped fixed contact patterns and a circular movable conductive portion.

CITATION LIST

Patent Literature

Patent Literature 1: JP H08-235952A

SUMMARY OF INVENTION

Technical Problem

As shown in FIG. 13A, external wiring patterns 98 and 99 are connected to a pair of fixed contact patterns 202A and 202B at contact points pS and pE, which are power feed portions. A movable conductive portion 201 shorts a portion of the combs in the fixed contact patterns 202A and 202B, thus performing switching. At this time, a conductive path is formed from the contact point pS to the contact point pE via the movable conductive portion 201. The length of this conductive path is L11. Also, in the example shown in FIG. 13B, the length of the conductive path from the contact point pS to the contact point pE is L12.

Here, a highly conductive material such as copper foil is used for the external wiring patterns 98 and 99, but from the viewpoint of cost reduction, the fixed contact patterns 202A and 202B and the movable conductive portion 201 are made of carbon, which has a lower conductivity than copper foil. Carbon has a higher electric resistance than copper foil, and therefore the resistance characteristic degrades if the conductive path through carbon is too long. This has a negative influence on operation detection precision as well. A shorter conductive path during switching is more advantageous. In order to shorten the conductive path, it is desirable to give consideration not only to the distance from the power feed portion to the position of contact between the movable conductive portion 201 and the fixed contact patterns 202A and 202B, but also to the conductive path formed in the movable conductive portion 201 as well.

One aspect of the present invention was achieved in order to solve the above-described problem in conventional technology, and an object of this aspect of the present invention is to provide an operator device for an electronic musical instrument that can improve the resistance characteristic of the conductive path during switching.

Solution to Problem

In order to achieve the aforementioned object, an operator device for an electronic musical instrument according to one aspect of the present invention includes: a substrate; a first fixed conductive portion and a second fixed conductive portion that are arranged on the substrate and make up a pair of electrodes; a first main conductive pattern and a second main conductive pattern that are arranged on the substrate, have a higher conductivity than the first and second fixed conductive portions, and respectively correspond to the first fixed conductive portion and the second fixed conductive portion; and a movable conductive portion that is configured to move by an operation performed on the operator, and electrically shorts the first fixed conductive portion and the second fixed conductive portion upon coming into contact with both of them, wherein the first fixed conductive portion and the second fixed conductive portion are each constituted by at least one strip member, and the strip member constituting the first fixed conductive portion and the strip member constituting the second fixed conductive portion are aligned in parallel and in an alternating manner, and at least two end portions of the strip member constituting the first fixed conductive portion are electrically connected to the first main conductive pattern, and at least two end portions of the strip member constituting the second fixed conductive portion are electrically connected to the second main conductive pattern.

Advantageous Effects of Invention

According to the present invention, it is possible to improve the resistance characteristic of the conductive path during switching.

BRIEF DESCRIPTION OF DRAWINGS

FIG. 1A is a schematic diagram of a portion of an electronic musical instrument to which an operator device according to a first embodiment is to be applied;

FIG. 2 is a schematic diagram of a specific example of a pair of fixed conductive portions;

FIG. 10A is a diagram showing a resist;

FIG. 10B is a diagram showing three sets of first and second fixed conductive portions;

FIG. 11B is a diagram showing a variation of three sets of second fixed conductive portions;

DESCRIPTION OF EMBODIMENTS

Hereinafter, embodiments of the present invention will be described with reference to the drawings.

First Embodiment

FIG. 1A is a schematic diagram showing a portion of an electronic musical instrument to which an operator device according to a first embodiment of the present invention is to be applied. A keyboard device of this electronic musical instrument has multiple keys 92 as playing operators. A substrate 93 is arranged under the keys 92, and switch bodies 10 are arranged on the substrate 93. When one of the keys 92 is operated by being pressed, it pivots about a fulcrum 91 and drives one of the switch bodies 10.

Figure 1B:
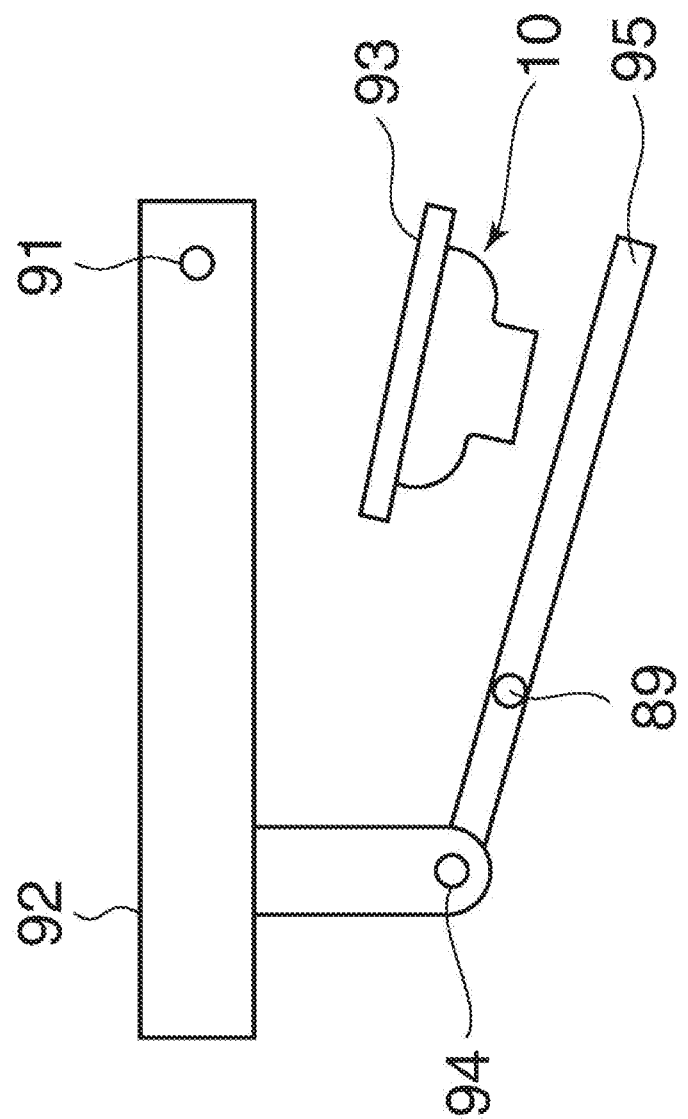
FIG. 1B is a schematic diagram of the portion of the electronic musical instrument to which the operator device according to the first embodiment is to be applied.
Figure 1C:
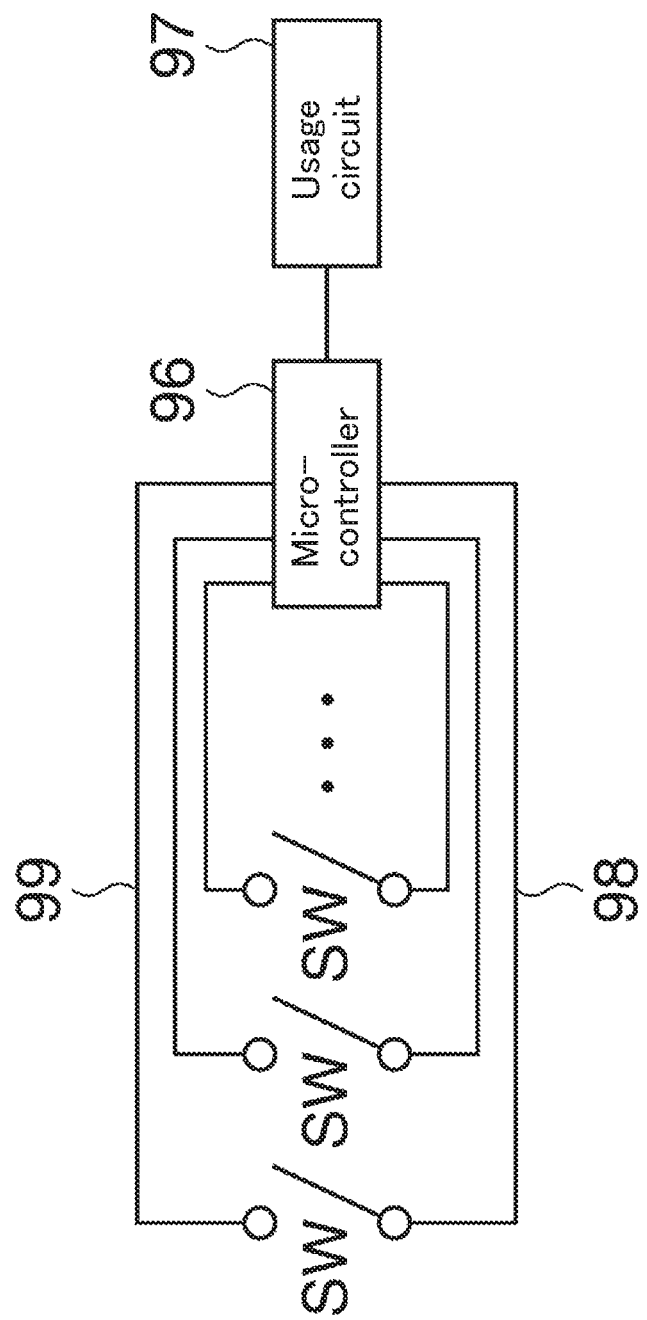
FIG. 1C is a partial configuration diagram of a control circuit in a single-throw switch.

Note that the driving bodies (operators) that drive the switch bodies 10 are not limited to being the keys 92, and may be hammers instead. In one example, as shown in FIG. 1B, a hammer 95 is pivotably coupled to a key 92 by a pivot shaft portion 94. The hammer 95 is arranged so as to be capable of pivoting about a fulcrum 89. The substrate 93 is arranged above the hammer 95, and the switch body 10 is arranged on the lower surface of the substrate 93. When the key 92 is operated by being pressed, the hammer 95 is driven via the pivot shaft portion 94, and the hammer 95 pivots about the fulcrum 89 and drives the switch body 10.

Incidentally, the switch bodies 10 each have a basic configuration in which one contact switch is constituted by a movable contact and fixed contacts. The switch body 10 has a movable conductive portion 101 that is configured to move by a driving body, and a pair of fixed conductive portions 102 that are arranged on the substrate 93, and these portions constitute one switch SW. The movable conductive portion 101 electrically shorts the pair of fixed conductive portions 102 upon coming into contact with both of them, thus performing switching. The switch SW is provided in correspondence with the driving body, and the same number of switches SW as the number of keys 92 are provided in this embodiment. Hereinafter, for the sake of convenience, the following description will take the example of a single-throw switch body 10 in which one switch corresponds to one key 92.

FIG. 10 is a partial configuration diagram of a control circuit in a single-throw switch. Switches SW are collectively organized into blocks for each key, the blocks are individually connected to a microcontroller 96, and various types of music control are performed by performing time-division key scanning in units of blocks. External wiring patterns 98 and 99 are connected to the microcontroller 96. The movable conductive portion 101 puts the external wiring patterns 98 and 99 into conduction with each other. The microcontroller 96 includes a CPU and a storage unit, and is connected to a usage circuit 97. The usage circuit 97 has a function for generating physical sounds and forming various types of musical sounds, and also has the musical sound production functionality of an amplifier, a speaker, or the like.

FIG. 2 is a schematic diagram showing a specific example of the pair of fixed conductive portions 102 in the present embodiment. In this figure, the surface of the substrate 93 on the side having the fixed conductive portions 102 arranged thereon is viewed from the perpendicular direction.

The pair of fixed conductive portions 102 includes a first fixed conductive portion cA and a second fixed conductive portion cB that make up a pair of electrodes. The fixed conductive portions cA and cB both do not have a comb teeth shape overall. Specifically, the fixed conductive portions cA and cB respectively have strip members tA and tB that are shaped as long and thin strips, and the strip members tA and tB (referred to as "strip members t" hereinafter when not distinguishing between them, and the same following for the reference signs of other constituent elements as well) are aligned in parallel with each other. A first main conductive pattern dA and a second main conductive pattern dB are arranged on the substrate 93 in correspondence with the first fixed conductive portion cA and the second fixed conductive portion cB respectively. Note that either or both of the external wiring patterns 98 and 99 as well as either or both of the main conductive patterns dA and dB may be arranged on the lower surface of the substrate 93. The main conductive patterns dA and dB are electrically connected to the external wiring patterns 98 and 99 respectively.

Both a first end portion tAf and a second end portion tAr of the strip member tA in the extending direction (lengthwise direction) thereof are electrically connected to the first main conductive pattern dA. Both a first end portion tBf and a second end portion tBr of the strip member tB in the extending direction thereof are electrically connected to the second main conductive pattern dB.

The movable conductive portion 101 and the strip members t are constituted by a conductive material such as carbon. However, a conductive material other than carbon may be used, such as gold plating, pressure-sensitive ink, silver paste, or a conductive paste made up of a conductive filler and a binder such as epoxy resin. The main conductive patterns dA and dB are formed using a material that is sufficiently more conductive than the strip members t, such as a copper foil pattern.

Figure 3:
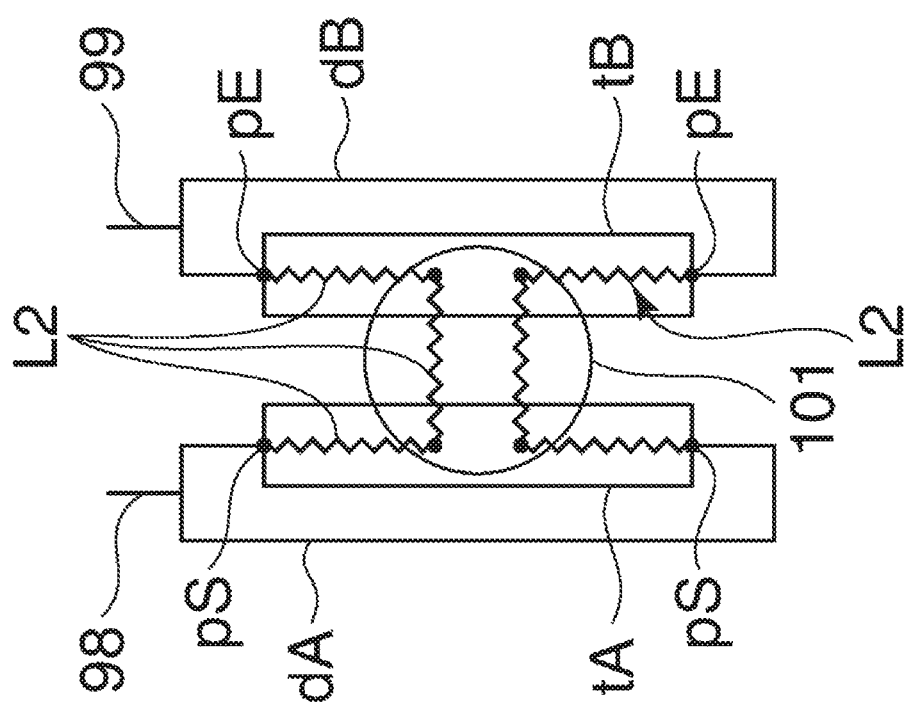
FIG. 3 is a schematic diagram of conductive paths in a switch configured as shown in FIG. 2.
Figure 4:
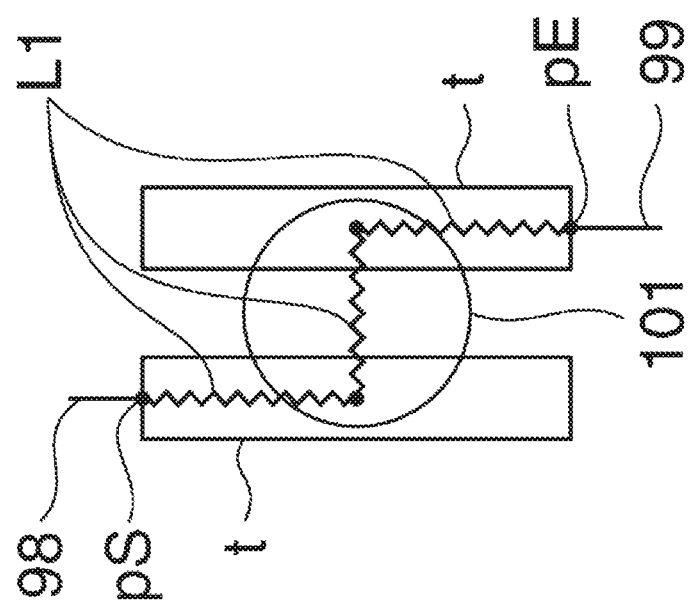
FIG. 4 is a schematic diagram of a conductive path in a switch configured as described in a comparative example.

In the switch SW, conductive paths are formed during switching due to the movable conductive portion electrically shorting the corresponding pair of fixed conductive portions upon coming into contact with both of them, and these conductive paths will be compared with a configuration according to a comparative example. FIG. 3 is a schematic diagram of conductive paths in the switch SW of the present embodiment shown in FIG. 2. FIG. 4 is a schematic diagram of a conductive path in a switch configured as described in a comparative example.

Figure 13A:
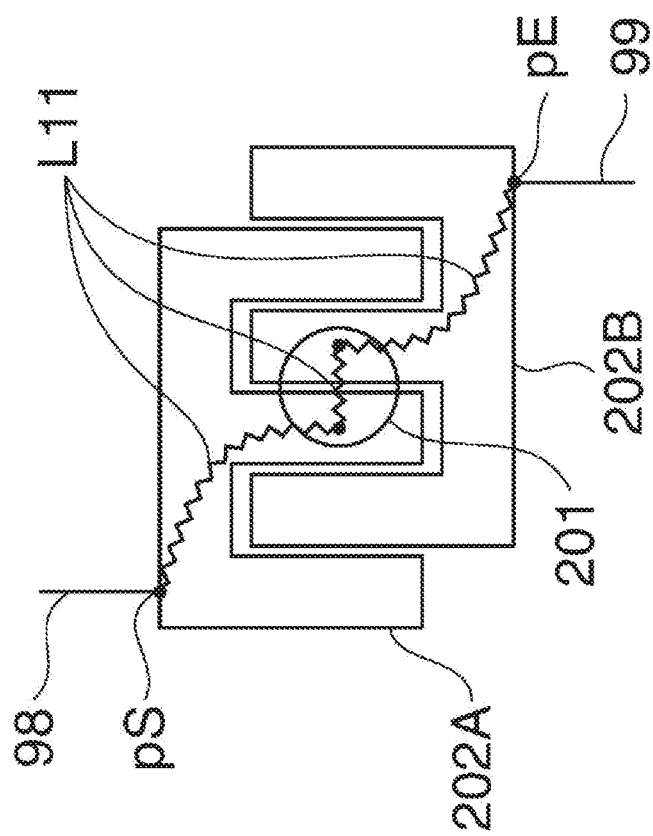
FIG. 13A is a schematic diagram showing contact between comb teeth-shaped fixed contact patterns and a circular movable conductive portion.
Figure 13B:
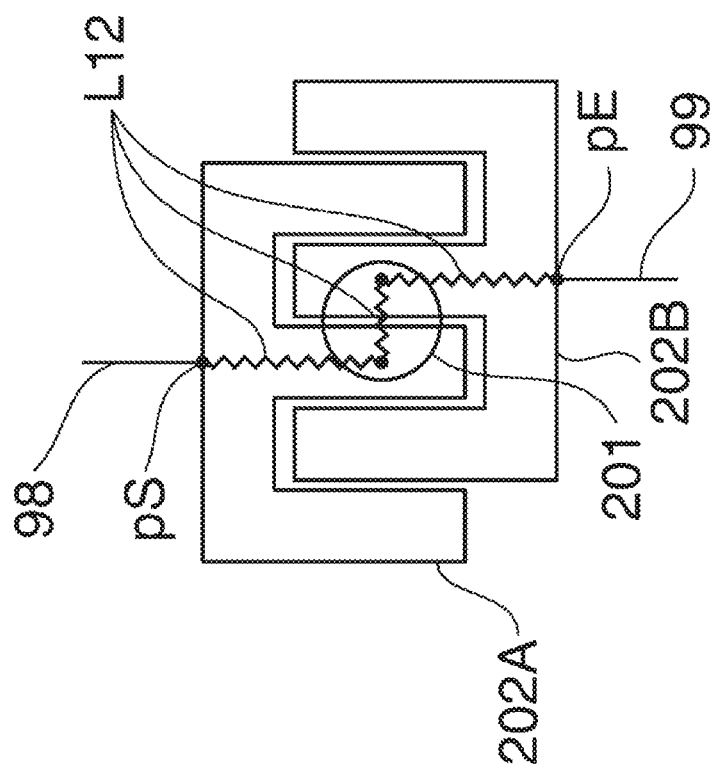
FIG. 13B is a schematic diagram showing contact between comb teeth-shaped fixed contact patterns and a circular movable conductive portion.

Assume that strip members are employed in the switch of the comparative example shown in FIG. 4 as well, and that the external wiring patterns 98 and 99 are respectively connected to one end portion of each of the strip members t at the contact points pS and pE, which are power feed portions, as in the conventional example (FIGS. 13A and 13B). The length of the conductive path formed from the contact point pS to the contact point pE via the movable conductive portion 101 is L1.

However, in the switch SW of the present embodiment (FIG. 2), the external wiring patterns 98 and 99 are respectively connected to both end portions of the strip members tA and tB at the contact points pS and pE, which are power feed portions, via the main conductive patterns dA and dB. Accordingly, as shown in FIG. 3, a conductive path from the contact point pS to the contact point pE is formed via the movable conductive portion 101 on the first end portion tAf and tBf side, and a conductive path from the contact point pS to the contact point pE is formed via the movable conductive portion 101 on the second end portion tAr and tBr side as well. The lengths of these two conductive paths are both l2.

The resistance value of a conductive path is proportional to the length thereof. Here, the material making up the movable conductive portion 101 and the strip members t is carbon in both the conventional example and the present embodiment. A comparison of the lengths shows that l2 is less than or equal to L1, and a comparison of one conductive path in the comparative example and the present embodiment shows that the resistance value in the comparative example is greater than or equal to that in the present embodiment. Furthermore, in the present embodiment, two conductive paths with the length l2 are formed in parallel, and the value of the combined resistance in the present embodiment can be reliably set to a value smaller than, specifically ½ or less than, the resistance value in the comparative example.

For this reason, according to the present embodiment, it is possible to improve the resistance characteristic of the conductive path formed by the movable conductive portion 101 and the fixed conductive portions 102 during switching. Accordingly, it is possible to raise the operation detection precision.

Next, modified examples of the first embodiment will be described with reference to FIGS. 5 to 7.

Figure 5:
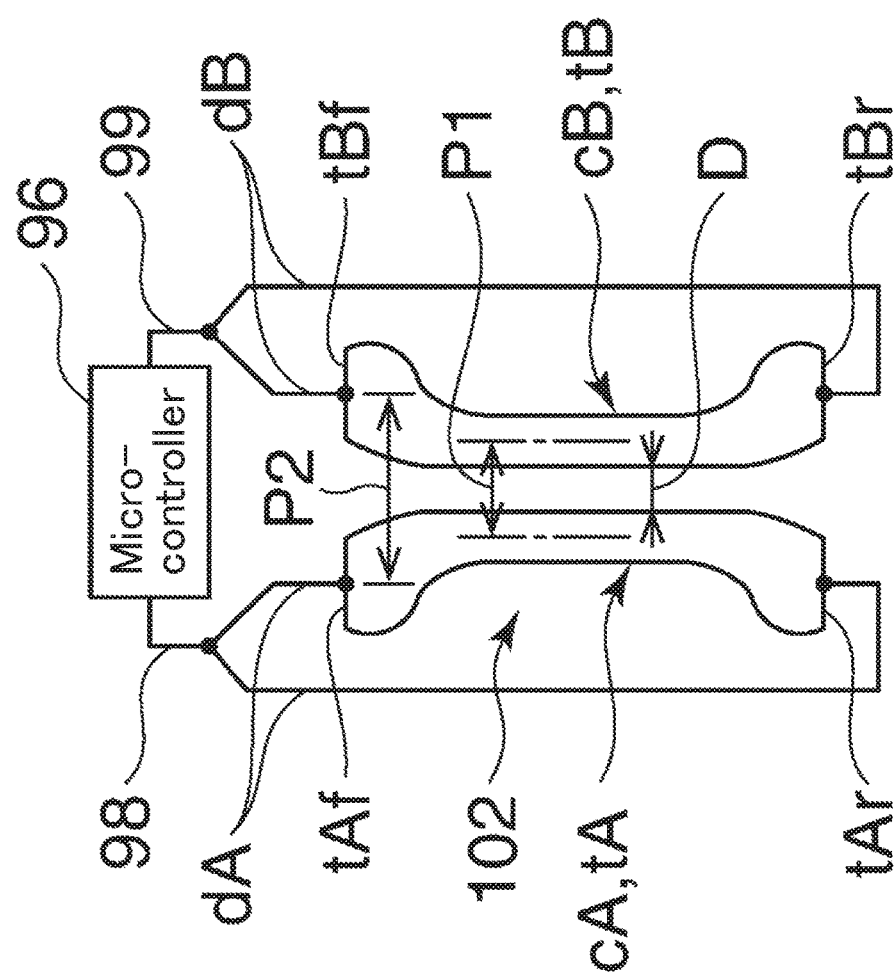
FIG. 5 is a schematic diagram of a specific example of a pair of fixed conductive portions according to a first modified example.

FIG. 5 is a schematic diagram of a specific example of the pair of fixed conductive portions 102 according to a first modified example. In the configuration shown in FIG. 2, the strip members tA and tB are rectangular, and therefore an arrangement pitch P of the strip members tA and tB is the same at all positions in the extending direction, which is the direction orthogonal to the width direction (alignment direction). The arrangement pitch P is defined as the distance between intermediate positions in the alignment direction. Note that letting D be the gap between the closest portions of the adjacent strip members tA and tB, the gap D is the same at all positions in the extending direction of the strip members tA and tB.

In contrast, in the first modified example (FIG. 5), the strip members tA and tB are not shaped as simple rectangles, and instead the first end portions tAf and tBf and the second end portions tAr and tBr deviate outward in the width direction relative to the central portions in the extending direction. An arrangement pitch P1 in the central portion in the extending direction of the strip members tA and tB is smaller than an arrangement pitch P2 in the two end portions of the strip members tA and tB. Also, the gap D in the central portion in the extending direction is smaller than the gap D in the two end portions. Note that the arrangement pitch P2 in the end portions is approximately the same value as the arrangement pitch P in FIG. 2 (P1<P2≈P).

Figure 6:
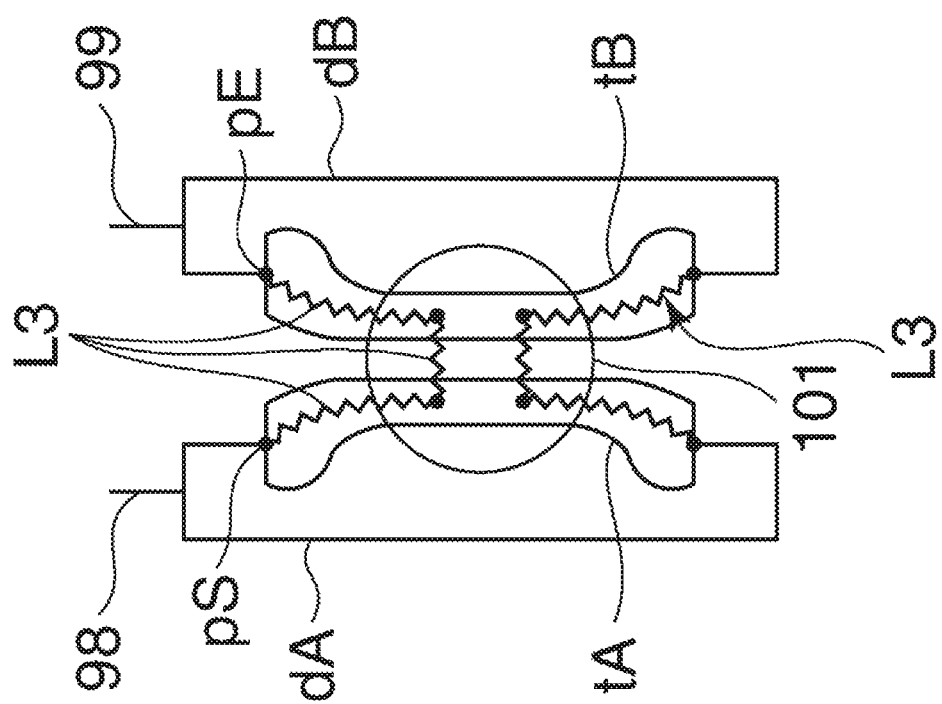
FIG. 6 is a schematic diagram of conductive paths in a switch configured as described in the first modified example.

FIG. 6 is a schematic diagram of conductive paths in the switch SW of the first modified example shown in FIG. 5. In this example, the positions of the contact points pS and pE are the same as in the example in FIG. 3. However, the arrangement pitch P1 in the central portion in the extending direction is smaller, and therefore the conductive path in the movable conductive portion 101 is shorter. As a result, a length L3 of the conductive path formed from the contact point pS to the contact point pE via the movable conductive portion 101 is less than or equal to the length L2 (L3≤L2). Accordingly, the resistance value for the total length of the conductive path can be readily set smaller than in the configuration shown in FIG. 2, and this is advantageous in improving the resistance characteristic.

Figure 7:
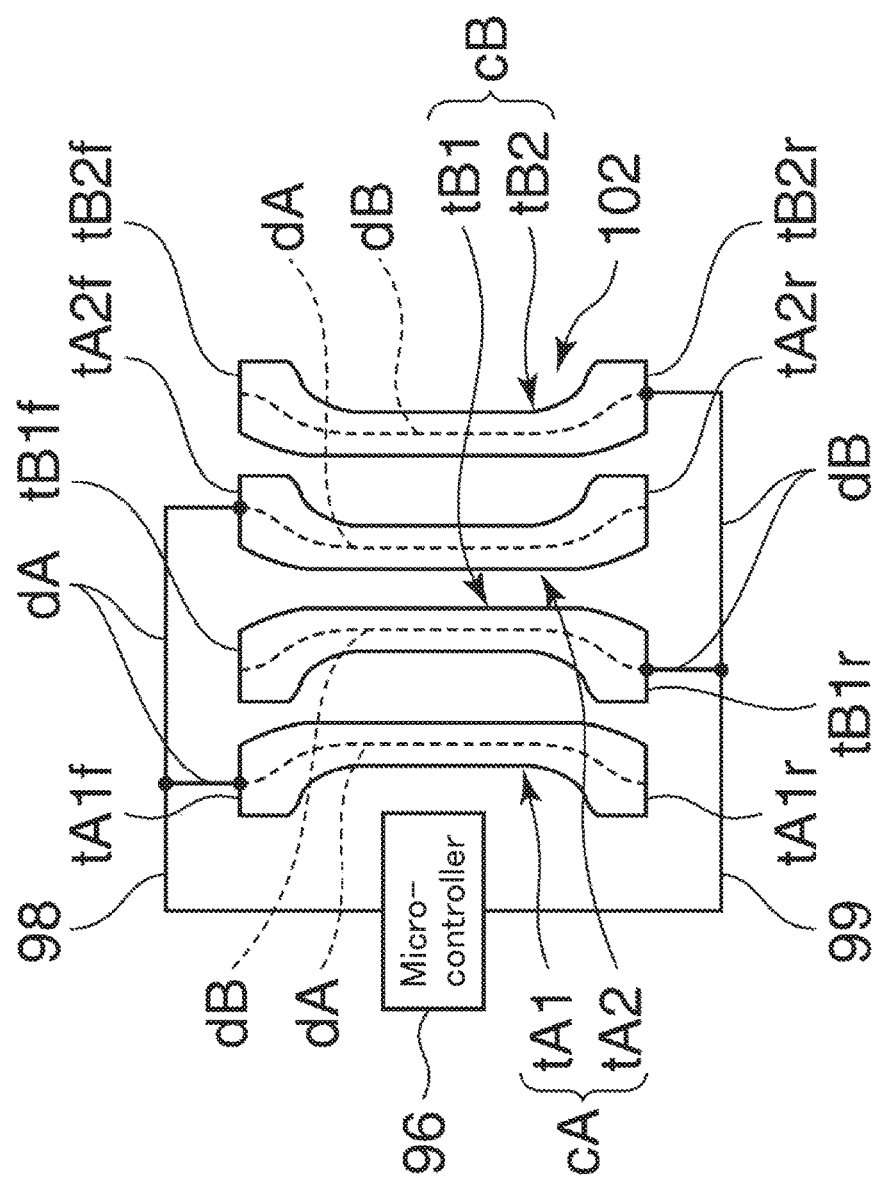
FIG. 7 is a schematic diagram of a specific example of a pair of fixed conductive portions according to a second modified example.

FIG. 7 is a schematic diagram of a specific example of the pair of fixed conductive portions 102 according to a second modified example. Multiple strip members tA (tA1, tA2) and tB (tB1, tB2) may constitute the fixed conductive portions cA and cB respectively. In this case, the strip members tA and the strip members tB are alternatingly arranged in parallel. In the exemplary configuration according to the second modified example (FIG. 7), two strip members tA and two strip members tB are provided. The strip members tA1, tB1, tA2, and tB2 are arranged side-by-side in the stated order. It should be noted that it is not easy to make a connection to the main conductive patterns dA and dB in the two end portions, and therefore the main conductive patterns dA and dB are arranged so as to also extend under the strip members tA and tB.

As shown in FIG. 7, the first main conductive pattern dA also extends under the strip members tA1 and tA2 on the substrate 93. Accordingly, practically, the first end portion tA1f and the second end portion tA1r have approximately the same potential, and the first end portion tA2f and the second end portion tA2r also have approximately the same potential. Similarly, the second main conductive pattern dB also extends under the strip members tB1 and tB2. Accordingly, practically, the first end portion tB1f and the second end portion tB1r have approximately the same potential, and the first end portion tB2f and the second end portion tB2r also have approximately the same potential.

In this example as well, similarly to the first modified example (FIG. 5), the arrangement pitch of the central portion in the extending direction is smaller than that of the two end portions of the strip members t (on the first end portion tA2f and tB1f side, and on the second end portion tA2r and tB1r side). Accordingly, even with a configuration in which the fixed conductive portions cA and cB each have two or more strip members t, the resistance value for the total length of the conductive path can be readily set smaller than in the configuration shown in FIG. 2, and this is advantageous in improving the resistance characteristic. Note that the strip members t need only be shaped as long and thin strips, are not required to have straight line portions, and may have an overall curved shape.

Second Embodiment

In the configuration of the first embodiment, the switch body 10 has one switch SW. However, two or more switches SW may be provided, and there are three switches SW in an exemplary configuration according to a second embodiment of the present invention.

Figure 8A:
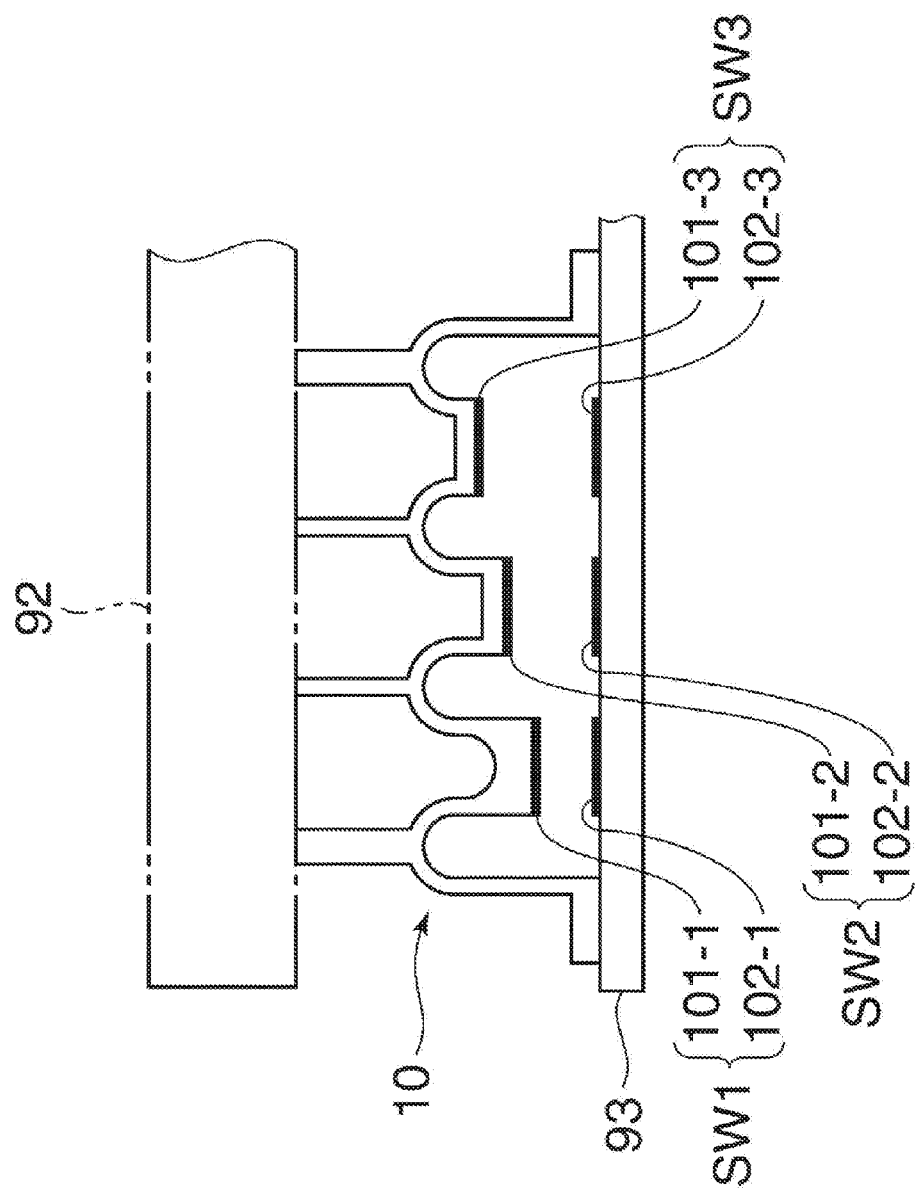
FIG. 8A is a schematic diagram of a switch body region of an electronic musical instrument to which an operator device according to a second embodiment is to be applied.

FIG. 8A is a schematic diagram of the switch body 10 region of an electronic musical instrument to which an operator device according to the second embodiment is to be applied. The key 92 is used as the driving body, but the driving body may be the hammer 95. The switch body 10 is a triple-throw switch and has three sets of switches SW (SW1 to SW3), each of which includes a pair of fixed conductive portions 102 and one movable conductive portion 101. The switches SW1 to SW3 are arranged in a line in the lengthwise direction of the key 92. A movable conductive portion 101-1 and a pair of fixed conductive portions 102-1 constitute the switch SW1, a movable conductive portion 101-2 and a pair of fixed conductive portions 102-2 constitute the switch SW2, and a movable conductive portion 101-3 and a pair of fixed conductive portions 102-3 constitute the switch SW3.

Figure 8B:
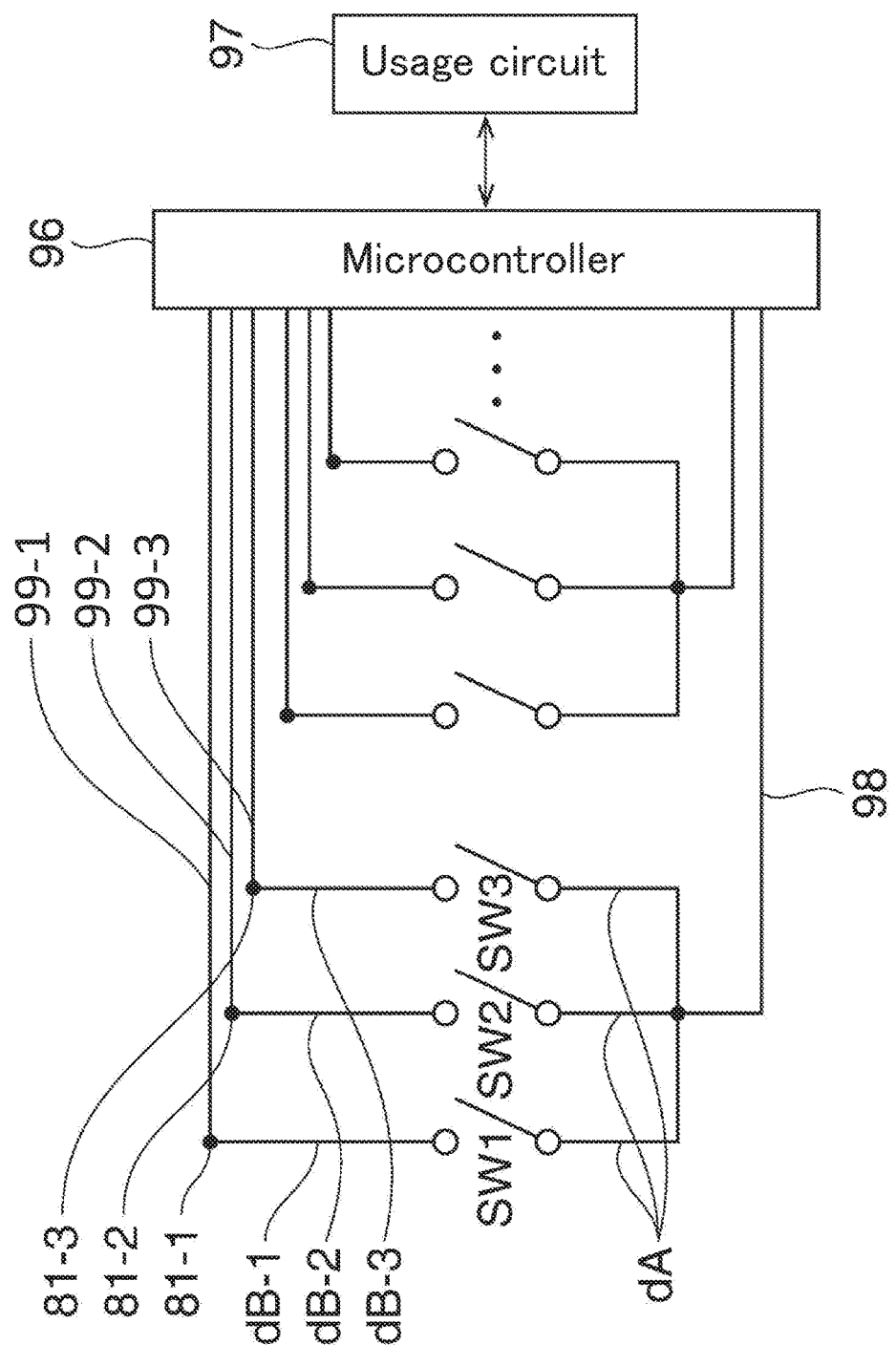
FIG. 8B is a partial configuration diagram of a control circuit according to the second embodiment.

FIG. 8B is a partial configuration diagram of a control circuit. The switches SW1, SW2, and SW3 are each connected to the external wiring pattern 98 via the first main conductive pattern dA. Also, the switches SW1, SW2, and SW3 are respectively connected to external wiring patterns 99-1, 99-2, and 99-3 via second main conductive patterns dB-1, dB-2, and dB-3. The second main conductive patterns dB-1, dB-2, and dB-3 are connected to the external wiring patterns 99-1, 99-2, and 99-3 through through-holes 81 (81-1, 81-2, 81-3) formed in the substrate 93. Two through-holes 81 are provided for each of the switches SW. Other configurations of the control circuit are the same as in the first embodiment.

Figure 9A:
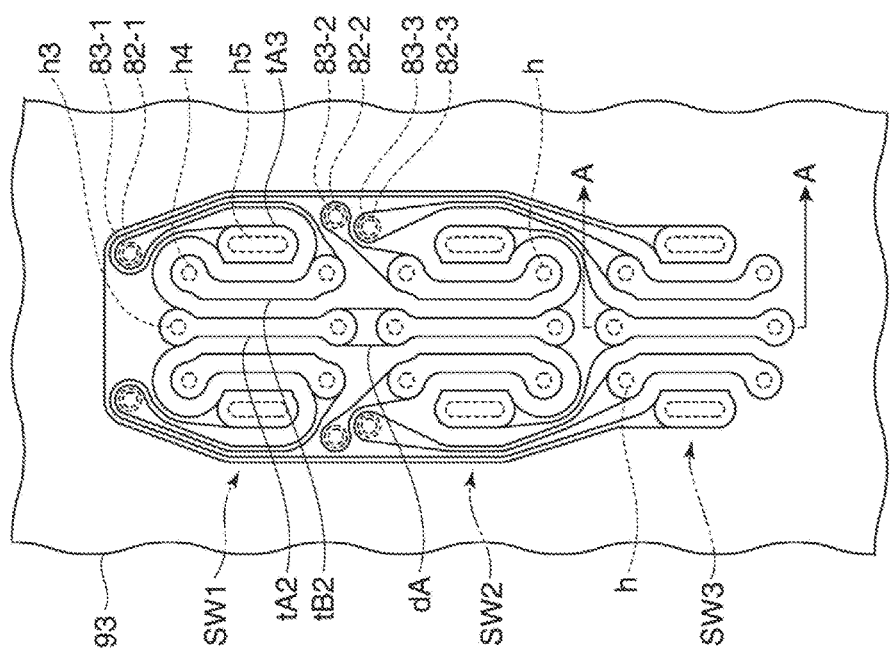
FIG. 9A is a diagram showing a configuration of the fixed members that are arranged on a substrate in three sets of switches.
Figure 9B:
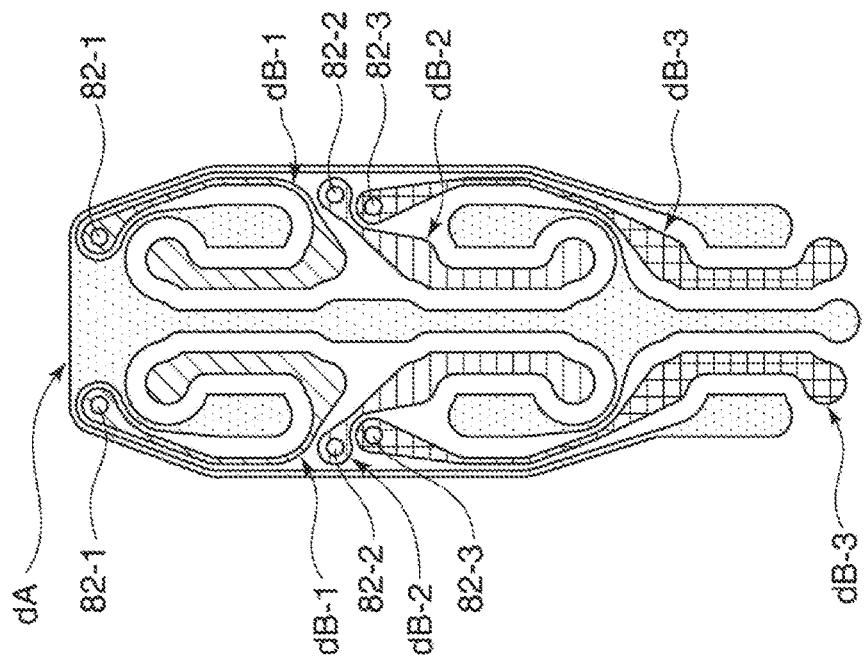
FIG. 9B is a diagram showing first and second main conductive patterns.
Figure 10C:
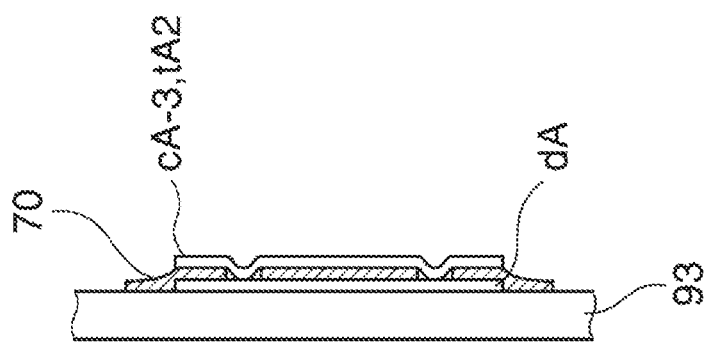
FIG. 10C is a cross-sectional diagram taken along line A-A in FIG. 9A.

FIG. 9A is a diagram showing a configuration of the fixed members that are arranged on the substrate 93 in the three sets of switches SW. FIG. 9B is a diagram showing the first main conductive pattern dA and the second main conductive patterns dB. FIG. 10A is a diagram showing a resist. FIG. 10B is a diagram showing three sets of first fixed conductive portions cA and three sets of second fixed conductive portions cB. FIG. 10C is a cross-sectional diagram taken along line A-A in FIG. 9A.

First, as partially shown in FIG. 10C as well, the fixed members of the switches SW have a three-layer structure in which the main conductive patterns dA and dB are provided on the upper side of the substrate 93, a resist 70, which is an insulating material, is provided on the upper sides of the main conductive patterns dA and dB, and then the fixed conductive portions cA and cB are provided on the upper side of the resist 70.

As shown in FIG. 10B, the first fixed conductive portions cA (cA-1, cA-2 cA-3) and the second fixed conductive portions cB (cB-1, cB-2, cB-3) constitute the fixed conductive portions 102-1, 102-2, and 102-3. The first fixed conductive portion cA-1 has strip members tA1, tA2, and tA3, and the second fixed conductive portion cB-1 has strip members tB1 and tB2. In this way, an odd number of strip members t constitute the first fixed conductive portion cA, and an even number of strip members t constitute the second fixed conductive portion cB. It should be noted that the numbers of strip members t that constitute the fixed conductive portions cA and cB are not limited to this example, and in the case where the fixed conductive portions cA and cB are constituted by multiple strip members t, the fixed conductive portions cA and cB may be constituted by either an even number or an odd number of strip members t.

As shown in FIG. 9B, the first main conductive pattern dA is a common conductive portion that is common to the three first fixed conductive portions cA-1, cA-2, and cA-3, and is formed as a single body. On the other hand, in the case of the second main conductive pattern dB, the second main conductive patterns dB-1, dB-2, and dB-3 are formed so as to be physically separated from each other in correspondence with the three second fixed conductive portions cB-1, cB-2, and cB-3. The main conductive patterns dB-1, dB-2, and dB-3 are formed two each. Holes 82 (82-1, 82-2, 82-3) are formed in the main conductive patterns dB-1, dB-2, and dB-3 in correspondence with the through-holes 81 (81-1, 81-2, 81-3).

The following describes the fixed conductive portions cA-1 and cB-1 as representatives among the three fixed conductive portions cA and cB, with reference to FIG. 10B. The strip members tA1, tB1, tA2, tB2, and tA3 are arranged side-by-side in the stated order. The arrangement direction of the strip members t (the left-right direction in FIG. 10B) is approximately orthogonal to the extending direction of the strip members t (the up-down direction in FIG. 10B). Also, the switches SW1 to SW3 are arranged along the extending direction of the strip members t. Accordingly, the alignment direction of the strip members t is approximately orthogonal to the arrangement direction of the switches SW1 to SW3 (lengthwise direction of the key 92). The strip member tA2 that constitutes the first fixed conductive portion cA-1 is located in the center in the alignment direction among the five strip members t, and the length of the strip member tA2 is the longest among the five strip members t. Also, the lengths of the five strip members t are shorter the farther the strip members t are from the center in the alignment direction. Accordingly, the overall shape formed by the five strip members t is an ellipse that is elongated in the alignment direction. Considering the operation of the key 92 and the hammer 95, the region of the fixed conductive portions 102 that is envisioned to come into contact with the movable conductive portion 101 in the direction orthogonal to the alignment direction of the strip members t is thought to be shorter the farther the position is from the center in the alignment direction. For this reason, even if the strip members t far from the center in the alignment direction are formed with a long length, portions that do not come into contact with the movable conductive portion 101 would merely increase in size, and this would not have much meaning. In view of this, the lengths satisfy the relationship tA1=tA3<tB1=tB2<tA2. Accordingly, it is possible to reduce the amount of needless space for arrangement of the strip members t.

Also, the configurations shown in FIGS. 5 and 7 are employed for the arrangement pitch of the strip members t. In other words, the arrangement pitch in the central portion in the extending direction is smaller than the arrangement pitch in the two end portions of the strip members t. Regarding the gap as well, the gap is smaller in the central portion in the extending direction than in the two end portions of the strip members t.

As shown in FIG. 10A, holes 83 (83-1, 83-2, 83-3) are formed in the resist 70 in correspondence with the through-holes 81 (81-1, 81-2, 81-3). The resist 70 is also provided with multiple conduction holes h for putting the main conductive patterns dA and dB and the fixed conductive portions cA and cB, which are laminated on each other, into conduction with each other. In the case of the configuration corresponding to the fixed conductive portions cA-1 and cB-1, conduction holes h1 to h8 are formed. Specifically, conduction holes h2 and h6 are formed at positions corresponding to the first end portion tB1f and the second end portion tB1r of the strip member tB1. Conduction holes h3 and h7 are formed at positions corresponding to the first end portion tA2f and the second end portion tA2r of the strip member tA2. Conduction holes h4 and h8 are formed at positions corresponding to the first end portion tB2f and the second end portion. tB2r of the strip member tB2. A conduction hole h1 is formed in correspondence with the strip member tA1. A conduction hole h5 is formed in correspondence with the strip member tA3.

As can be understood from FIGS. 9B, 10A, and 10B, the strip members tA1, tA2, and tA3 come into contact with and into electrical conduction with the first main conductive pattern dA through the conduction holes h1, h3, h7, and h5. The strip members tB1 and tB2 come into contact with and into electrical conduction with the second main conductive patterns dB through the conduction holes h2, h4, h6, and h8. In particular, in the case of the strip member tA2, the two end portions thereof (tA2f, tA2r) come into contact with the first main conductive pattern dA, and therefore the two end portions practically have approximately the same potential. In the case of the strip members tB1 and tB2 as well, the two end portions thereof (tB1f, tB1r, tB2f, tB2r) come into contact with the second main conductive patterns dB, and therefore the two end portions practically have approximately the same potential.

Note that the strip members tA1 and tA3 have a short length, and therefore one corresponding conduction hole h is provided for each of them, and the conduction efficiency is raised by causing the region spanning the two end portions in the extending direction of the strip members tA1 and tA3 to come into contact with the first main conductive pattern dA, but conduction holes h may be provided at positions corresponding to the two end portions. Also, in the case of the strip members tA2, tB1, and tB2, a configuration is possible in which a conduction hole h is added at a position corresponding to an intermediate position in the extending direction, thus causing these strip members to come into contact with the main conductive patterns dA and dB at an intermediate position in the extending direction in addition to the two end portions. The configurations of the fixed conductive portions cA-2, cA-3, cB-2, and cB-3 and the corresponding conduction holes h are the same as the configurations of the fixed conductive portions cA-1 and cB-1 and the corresponding conduction holes h.

Note that the relationship between the arrangement ranges of the fixed conductive portions cA and cB and the main conductive patterns dA and dB is as follows. As partially illustrated in FIG. 10C, the fixed conductive portions cA and cB are arranged on the upper sides of the main conductive patterns dA and dB, in ranges contained within the main conductive patterns dA and dB. Specifically, the fixed conductive portions cA and cB are arranged in ranges that are smaller than or the same size as the ranges of the main conductive patterns dA and dB. In other words, the main conductive patterns dA and dB are formed so as to be somewhat larger than or the same size as the fixed conductive portions cA and cB, and therefore the fixed conductive portions cA and cB are formed in ranges that do not extend beyond the main conductive patterns dA and dB. Accordingly, in the present embodiment, the first fixed conductive portion cA is laminated on the first main conductive pattern dA, and, regarding the arrangement range of the strip members t in the extending direction, the arrangement range of the first main conductive pattern dA contains the arrangement range of the strip members t that constitute the first fixed conductive portion cA. Similarly, the second fixed conductive portion cB is laminated on the second main conductive pattern dB, and, regarding the arrangement range of the strip members t in the extending direction, the arrangement range of the second main conductive pattern dB contains the arrangement range of the strip members t that constitute the second fixed conductive portion cB.

The formation precision and positional precision of the fixed conductive portions cA and cB made of carbon or the like are lower than those of the main conductive patterns dA and dB made of copper foil or the like. For this reason, in order to avoid the risk of shorting, the fixed conductive portions cA and cB generally need to be separated farther from each other than the main conductive patterns dA and dB. In contrast, in the present embodiment, the fixed conductive portions cA and cB are formed in ranges that do not extend beyond the main conductive patterns dA and dB, as described above. Accordingly, the fixed conductive portions cA and cB are reliably formed on the main conductive patterns dA and dB, and the surfaces of the fixed conductive portions cA and cB and that come into contact with the movable conductive portion 101 are more readily made smooth. Also, the movable conductive portion 101 can be caused to come into contact with flat portions of the fixed conductive portions cA and cB, thus making it possible to raise the circuit reliability.

Note that from the viewpoints of cost reduction and compactness, regarding the arrangement range of the strip members t in the extending direction, it is preferable that the fixed conductive portions cA and cB geometrically match (are congruent with) the main conductive patterns dA and dB, and are exactly overlaid on each other without misalignment. However, in terms of the arrangement ranges, there may be slight differences between the two in at least one out of the shapes, positions, and sizes thereof, to the extent that there is no risk of shorting between patterns that do not have the same potential. In other words, the main conductive patterns dA and dB need only have shapes that conform to the strip members constituting the fixed conductive portions cA and cB. In other words, it is sufficient that the main conductive patterns dA and dB have shapes that are approximately the same as the strip members constituting the fixed conductive portions cA and cB, and that the arrangement ranges thereof approximately match each other. Due to the resist 70 being arranged between the fixed conductive portions cA and cB and the main conductive patterns dA and dB, as long as the conduction holes h1 to h8 do not extend beyond the patterns of the fixed conductive portions cA and cB, even if the main conductive patterns dA and dB extend beyond the patterns of the fixed conductive portions cA and cB, shorting will not occur in this circuit.

Also, in the present embodiment, as illustrated in FIG. 10B, the main conductive patterns dA and dB are configured such that the portions thereof having the strip members t that constitute the fixed conductive portions cA and cB laminated thereon are continuous without interruptions in the extending direction of the strip members t. If the main conductive patterns dA and dB were partially non-continuous, portions of the surfaces of the fixed conductive portions cA and cB that come into contact with the movable conductive portion 101 would be low regions, and the band-shaped contact region would be non-continuous. As the number of such regions increases, the contact area decreases in size, and the total resistance increases. The height of high positions on the contact surfaces also become unstable, and therefore the size of the contact area becomes unstable overall, and consequently the total resistance value also becomes unstable. Accordingly, in order to avoid this, it is preferable that the main conductive patterns dA and dB are configured such that at least the portions thereof having the strip members t laminated thereon are continuous without interruption in the extending direction of the strip members t.

As shown in FIG. 10B, the strip members tA2 in the center in the alignment direction in the respective first fixed conductive portions cA-1, cA-2, and cA-3 are connected by the same first main conductive pattern dA. In other words, regarding the relationship between two sets that are adjacent to each other, the end portion of the strip member tA2 of one of the sets is physically connected to the end portion of the strip member tA2 of the other adjacent set. All of the strip members tA1 and tA2 that constitute the first fixed conductive portions cA-1, cA-2, and cA-3 are in electrical conduction with each other via the first main conductive pattern dA. Note that not all of the strip members tA1, tA2 and tA3 that constitute the first fixed conductive portions cA-1, cA-2, and cA-3 are required to be in electrical conduction with each other. A configuration is possible in which at least one of strip members tA1, tA2 and tA3 of the fixed conductive portion is in electrical conduction with the one of other fixed conductive portion, and is connected to the microcomputer.

Figure 11A:
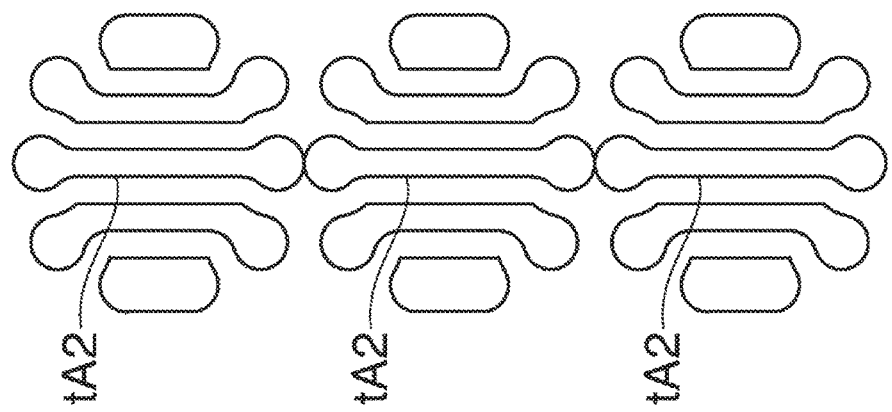
FIG. 11A is a diagram showing a variation of three sets of first fixed conductive portions.

Here, the adjacent end portions of the strip members tA2 in the center in the alignment direction are closer to each other than the adjacent end portions of the other strip members t. Normally, when compactly arranging the switches SW in a line, it is necessary to make the gap between the closest strip members t as short as possible, while also reliably ensuring the gap. However, in the configuration of the present embodiment, the three strip members tA2 may have the same potential, and therefore the gap between adjacent strip members tA2 can be easily set to a short gap. Alternatively, adjacent strip members tA2 may be formed so as to be continuous with each other. For example, as illustrated in FIG. 11A, a configuration is possible in which the gap between adjacent strip members tA2 is set to a gap of 0 by design, and the strip members tA2 may be non-continuous or continuous with each other. Alternatively, as illustrated in FIG. 11B, a configuration is possible in which adjacent strip members tA2 are continuous with each other, and consequently the three strip members tA2 are continuous with each other. In the case where there are three or more sets of switches SW, this configuration becomes difficult to realize with comb teeth-shaped fixed conductive portions. In the present embodiment, it is easy to arrange multiple switches SW close to each other.

Figure 12:
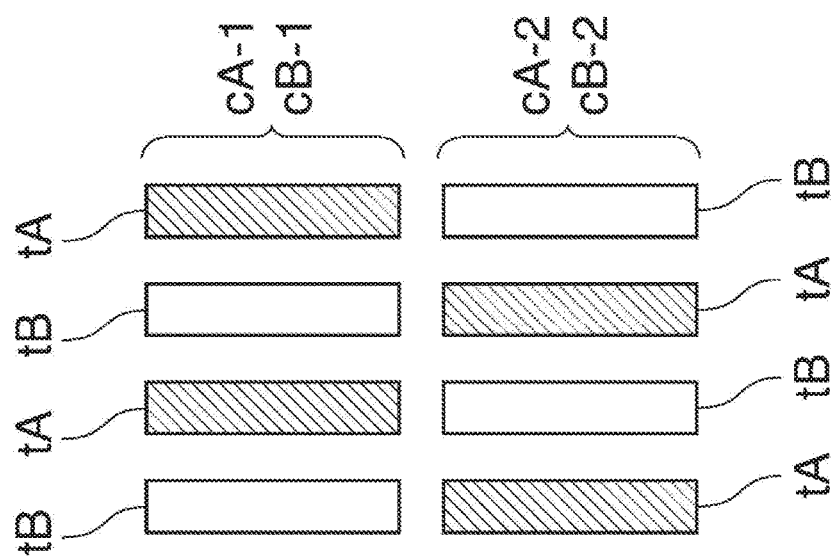
FIG. 12 is a schematic diagram of fixed conductive portions configured as described in a comparative example.

The following is a comparison given with reference to FIG. 12. FIG. 12 is a schematic diagram of fixed conductive portions configured as described in a comparative example. In the first switch, the strip members tA that constitute the first fixed conductive portion cA-1 and the strip members tB that constitute the second fixed conductive portion cB-1 are arranged in an alternating manner. In the second switch, the strip members tA that constitute the first fixed conductive portion cA-2 and the strip members tB that constitute the second fixed conductive portion cB-2 are arranged in an alternating manner, but the arrangement sequence is different from that of the first switch, such that they alternate. The strip members tA must not be in electrical conduction with the strip members tB, and therefore in order to reliably ensure gaps between adjacent end portions of the strip members tA and strip members tB, leeway needs to be provided in design, with consideration given to manufacturing tolerance as well. In comparison to the present embodiment, this is therefore a disadvantage in terms of the close arrangement of switches.

Note that from the viewpoint of achieving an advantage in terms of the close arrangement of switches, such a configuration may be applied to the relationship between specific strip members t other than the strip members tA2. A configuration is possible in which adjacent end portions of specific strip members t are electrically connected to each other such that the specific strip members t in all of the switches SW are in electrical conduction with each other.

According to the present embodiment, at least the two end portions of the strip members tA and tB are connected to the main conductive patterns dA and dB, thus making it possible to achieve the same effects as the first embodiment in terms of improving the resistance characteristic of the conductive path during switching.

Also, the arrangement pitch of the strip members t is smaller in the central portion in the extending direction than in the two end portions, and therefore it is possible to achieve the same effects as the configurations shown in FIGS. 5 and 7 in terms of making it easier to shorten the conductive path.

Also, according to the present embodiment, the fixed conductive portions cA and cB are formed in ranges that do not extend beyond the main conductive patterns dA and dB, and therefore the surfaces that come into contact with the movable conductive portion 101 are more readily made smooth, thus making it possible to raise the circuit reliability.

Also, in the present embodiment, in the relationship between switches SW that are adjacent to each other, the adjacent end portions of strip members tA2 are physically connected to each other. Specifically, multiple sets (three sets in the present embodiment) of conductive portions, each set including the first fixed conductive portion cA, the second fixed conductive portion cB, and the movable conductive portion 101, are provided in correspondence with one operator (switch body 10), the sets of conductive portions are arranged along the extending direction of the strip members t, and the respective adjacent end portions of the central strip member tA2 that constitutes the first fixed conductive portion cA of one set and the central strip member tA that constitutes the first fixed conductive portion cA of an adjacent set are physically connected to each other. Accordingly, it is easy to arrange multiple switches SW close to each other, thus making it possible to increase the degree of freedom in design, and also reduce cost. Note that the phrase "multiple sets of conductive portions are arranged along the extending direction of the strip member" refers to a state in which the arrangement direction of the sets and the extending direction of the strip member match each other to the extent that the end portions of strip members arranged in the center of adjacent sets can be physically connected, and the arrangement direction and the extending direction of the strip members are orthogonal to each other.

Also, in the present embodiment, the first fixed conductive portions cA (cA-1, cA-2, cA-3) each have three strip members tA (tA1, tA2, tA3), and the second fixed conductive portions cB (cB-1, cB-2, cB-3) each have two strip members tB (tB1, tB2). In this way, an odd number of strip members constitute the first fixed conductive portions, and an even number of strip members constitute the second fixed conductive portions, thus making it possible for the total number of strip members constituting the first and second fixed conductive portions to be an odd number, and making it possible for one of the strip members of the first fixed conductive portion to be arranged in the center overall. Accordingly, by setting a long length for the central strip member, and setting a shorter length for the strip members the closer they are to the two sides, it is possible to set the overall shape of the first and second fixed conductive portions to an elliptical shape. The key 92 and the substrate 93 of the electronic musical instrument according to the present embodiment have an elongated shape that is elongated in one direction, and their dimensional and positional precision are higher in the widthwise direction than in the lengthwise direction. For this reason, the probability distribution of positions of contact with the movable conductive portion has an elliptical shape. Accordingly, by setting the overall shape of the first and second fixed conductive portions to an elliptical shape, it is possible to cause the first and second fixed conductive portions and the movable conductive portion to efficiently come into contact with each other in the present embodiment. Also, in the case of providing multiple switches SW, as illustrated in FIGS. 11A and 11B, if the strip members tA2 arranged in the center of the first fixed conductive portions are physically connected to each other so as to have the same potential, shorting can occur between the switches SW, thus making it easy to arrange the switches SW close to each other.

Also, the lengths of the strip members t that constitute the fixed conductive portions cA and cB are shorter the farther the strip members t are from the center in the alignment direction, and therefore it is possible to reduce the amount of needless space for arrangement of the strip members t, while also giving consideration to the envisioned region of contact with the movable conductive portion 101.

Note that at the least, a configuration is possible in which merely the strip members t at the two ends (tA1, tA3) that are farthest from the center in the alignment direction come into full-area contact with the first main conductive pattern dA. In this case, for example, the conduction holes h1 and h5 may be made larger than the strip members tA1 and tA3 respectively Similarly, even in the case where either or both of the strip members t at the two ends are strip members tB, a configuration is possible in which that strip member tB or those strip members tB are in full-area contact with the second main conductive pattern dB. In other words, a configuration is possible in which in the strip members that constitute the first fixed conductive portion or the second fixed conductive portion and are located at the two ends in the alignment direction, the region spanning the two end portions in the extending direction comes into contact with the corresponding main conductive pattern. Accordingly, although the movable conductive portion 101 tends to unstably land on the strip members t at the two ends, the resistance value is lowered by causing the full area of the strip members t at the two ends to come into contact with the main conductive pattern, thus improving the resistance characteristic and making it possible to raise the operation detection precision.

Note that the present invention is also applicable to an operator other than a playing operator, and furthermore is also applicable to an electronic musical instrument other than a keyboard instrument.

Although the present invention has been described in detail above based on preferred embodiments, the present invention is not limited to these specific embodiments, and the present invention encompasses various modes that do not depart from the spirit of the invention. Portions of the embodiments described above may be combined as appropriate.

The invention claimed is:

1. An operator device for an electronic musical instrument, the operator device comprising:
   a substrate;
   a first fixed conductive portion and a second fixed conductive portion that are arranged on the substrate and make up a pair of electrodes;
   a first main conductive pattern and a second main conductive pattern that are arranged on the substrate, have a higher conductivity than the first and second fixed conductive portions, and respectively correspond to the first fixed conductive portion and the second fixed conductive portion; and
   a movable conductive portion that is configured to move by an operation performed on an operator, and electrically shorts the first fixed conductive portion and the second fixed conductive portion upon coming into contact with both of them,
   wherein the first fixed conductive portion and the second fixed conductive portion are each constituted by at least one strip member, and the strip member constituting the first fixed conductive portion and the strip member constituting the second fixed conductive portion are aligned in parallel and in an alternating manner, and
   at least two end portions of the strip member constituting the first fixed conductive portion are electrically connected to the first main conductive pattern, and at least two end portions of the strip member constituting the second fixed conductive portion are electrically connected to the second main conductive pattern.

2. The operator device for an electronic musical instrument according to claim 1, wherein in the strip members that constitute the first fixed conductive portion and the second fixed conductive portion, an arrangement pitch in an alignment direction of the strip members is smaller in a central portion in an extending direction of the strip members than in the two end portions of the strip members.

3. The operator device for an electronic musical instrument according to claim 1,
   wherein the first fixed conductive portion is arranged on an upper side of the first main conductive pattern in a range the same as a range of the first main conductive pattern, or is arranged on the upper side of the first main conductive pattern in a range that is contained within the range of the first main conductive pattern and is smaller than the range of the first main conductive pattern, and
   the second fixed conductive portion is arranged on an upper side of the second main conductive pattern in a range the same as a range of the second main conductive pattern, or is arranged on the upper side of the second main conductive pattern in a range that is contained within the range of the second main conductive pattern and is smaller than the range of the second main conductive pattern.

4. The operator device for an electronic musical instrument according to claim 1,
   wherein the first fixed conductive portion is laminated on the first main conductive pattern,
   an arrangement range of the first main conductive pattern in the extending direction of the strip members contains an arrangement range in the extending direction of the strip member constituting the first fixed conductive portion, a portion of the first main conductive pattern having the strip member constituting the first fixed conductive portion laminated thereon is continuous without interruption in the extending direction of the strip member, the second fixed conductive portion is laminated on the second main conductive pattern, an arrangement range of the second main conductive pattern in the extending direction of the strip members contains an arrangement range in the extending direction of the strip member constituting the second fixed conductive portion, and a portion of the second main conductive pattern having the strip member constituting the second fixed conductive portion laminated thereon is continuous without interruption in the extending direction of the strip member.

5. The operator device for an electronic musical instrument according to claim 1, wherein a plurality of sets of conductive portions, each set including a respective instance of the first fixed conductive portion, a respective instance of the second fixed conductive portion, and a respective instance of the movable conductive portion, are provided in correspondence with an operator, the plurality of sets are arranged along the extending direction of the strip members constituting the instances of the first fixed conductive portion and the instances of the second fixed conductive portion of the sets, and respective adjacent end portions of the strip member constituting the respective instance of the first fixed conductive portion of one set and the strip member constituting the respective instance of the first fixed conductive portion of an adjacent set are physically connected to each other.

6. The operator device for an electronic musical instrument according to claim 5, wherein the number of sets is three or more.

7. The operator device for an electronic musical instrument according to claim 1, wherein an odd number of strip members constitutes the first fixed conductive portion, and an even number of strip members constitute the second fixed conductive portion.

8. The operator device for an electronic musical instrument according to claim 1, wherein the length of each strip member constituting first fixed conductive portion and each strip member constituting the second fixed conductive portion is shorter the farther the strip member is from a center in an alignment direction of the strip members.

9. The operator device for an electronic musical instrument according to claim 1, wherein in strip members that constitute the first fixed conductive portion or the second fixed conductive portion and are located at two ends in the alignment direction, a region spanning two end portions in the extending direction comes into contact with the corresponding main conductive pattern.

* * * * *